United States Patent
Lin et al.

(10) Patent No.: US 6,716,757 B2
(45) Date of Patent: Apr. 6, 2004

(54) METHOD FOR FORMING BOTTLE TRENCHES

(75) Inventors: Shian-Jyh Lin, Taipei (TW); Chao-Sung Lai, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 12 days.

(21) Appl. No.: 10/430,874

(22) Filed: May 7, 2003

(65) Prior Publication Data

US 2003/0216044 A1 Nov. 20, 2003

(30) Foreign Application Priority Data

May 16, 2002 (TW) ........................................ 91110271 A

(51) Int. Cl.⁷ .................... H01L 21/762; H01L 21/8242
(52) U.S. Cl. ....................... 438/705; 438/243; 438/424; 438/704; 438/734; 438/701; 438/702; 438/386
(58) Field of Search ................................ 438/243–249, 438/386–392, 701, 702, 704, 734, 705, FOR 212, FOR 220, FOR 227

(56) References Cited

U.S. PATENT DOCUMENTS

| | | | | |
|---|---|---|---|---|
| 5,629,226 A | * | 5/1997 | Ohtsuki | 438/389 |
| 5,658,816 A | * | 8/1997 | Rajeevakumar | 438/386 |
| 5,692,281 A | * | 12/1997 | Rajeevakumar | 29/25.42 |
| 6,232,171 B1 | * | 5/2001 | Mei | 438/246 |
| 6,313,008 B1 | * | 11/2001 | Leung et al. | 438/424 |

* cited by examiner

*Primary Examiner*—George Fourson
(74) *Attorney, Agent, or Firm*—Nelson A. Quintero

(57) ABSTRACT

A method for forming bottle trenches. The method comprises providing a substrate formed with a pad stack layer on the top, and a deep trench with protective layer on the upper portions of sidewalls thereof, implanting ions into the lower portions of sidewalls and bottom of the trench not covered by the protective layer to amorphize the atomic structure of the sidewalls and bottom, oxidizing the amorphous sidewalls and bottom of the trench to form a bottle-shaped oxide layer thereon, and removing the bottle-shaped oxide layer.

15 Claims, 4 Drawing Sheets

METHOD FOR FORMING BOTTLE TRENCHES

BACKGROUND OF THE INVENTION

1. Field of the Invention

The present invention relates to a method for forming deep trenches for dynamic random access memory (DRAM). In particular, the invention involves the formation of bottle trenches for DRAMs.

2. Description of the Related Art

Generally speaking, capacitors widely used in dynamic random access memory (DRAM) are formed by two conductive layers (electrode plate) having an insulation layer between. The ability to store electric charges of a capacitor depends on the thickness of the insulation layer, surface area of the electrode plate and the electrical characteristics of the insulating material. In recent developments to reduce size of semiconductor elements to enhance integration density, memory cell area must be continuously reduced to hold a large number of memory cells, thereby increasing density. Meanwhile, the electrode plates of a capacitor in a memory cell must present sufficient surface area to store enough electric charge.

Nevertheless, where element size is continuously reducing, trench storage node capacitance of DRAM is decreased as well. As a result, storage capacitance must be increased to maintain good operating performance for memory.

Currently, the method for increasing storage capacitance for DRAMs increases the width of the bottom of the trench, thereby increasing surface area to form a bottle-shaped capacitor. The above method is carried out by selective oxidation of the upper portion of a trench to form a collar oxide layer to protect the upper portion of the trench. Next, the lower portion of the trench is wet-etched to form a bottle-shaped trench having a greater radius than the upper portion of the trench.

In a conventional process, a trench 16 is formed by anisotropic dry etching a substrate having a pad stack layer formed thereon, as shown in FIG. 1. The pad stack layer includes an oxide layer 12 and a nitride layer 14. However, there are often problems of lattice interface associated with <100> and <110> in the trench when adopting the above method. A trench having a sharply defined corners, denoted by number 18 in FIG. 1 is thus formed because etching is performed along the lattice interface. A trench having a sharp end as shown in FIG. 1 easily produces local strong electric field, thereby causing leakage. This shortcoming is not advantageous for DRAM capacitors. And it is unfavorable for follow-up process, as the implementation of process is more difficult.

SUMMARY OF THE INVENTION

In order to overcome the above problems, an object of the invention is to provide a method for forming bottle trenches, which involves amorphization of the sidewalls and bottom of the trench so that the lattice structure is broken up, followed by oxidation of the amorphous sidewalls and bottom of the trench to enlarge the lower portion of the trench to form a bottle trench. Another embodiment further comprises removing the oxidized part to form a bottle trench.

In order to achieve the above objects, there is provided a method for forming bottle trenches, comprising providing a substrate formed with a pad stack layer on the top, and a deep trench with a protective layer on the upper portions of sidewalls thereof, implanting ions into the lower portions of sidewalls and bottom of the trench not covered by the protective layer to amorphize the atomic structure of the sidewalls and bottom, oxidizing the amorphous sidewalls and bottom of the trench to form a bottle-shaped oxide layer thereon, and removing the bottle-shaped oxide layer.

According to another embodiment of the invention, the method for forming bottle trenches comprises providing a semiconductor substrate having an active region, forming a first pad oxide layer and a first pad nitride layer sequentially on the substrate to form a pad stack layer, defining the pad stack layer and the substrate to form a trench in the active region, forming a protective layer on the upper portion of the sidewalls of the trench, implanting ions into the lower portions of sidewalls and bottom of the trench not covered by the protective layer to amorphize the atomic structure of the sidewalls and bottom, and removing the amorphous sidewalls and bottom of the trench.

In the method of the present invention, the protective layer is preferably insulating material, such as silicon oxide, or silicon nitride. Ions for ion implantation are preferably Si, Ge or Ar, Ne, He of inert gas. Dosage is preferably 1e14~1e18 atom/cm$^2$. Other ions, such as P+ or As+ are applicable as well. Oxidation is preferably carried out by dry oxidation, wet oxidation, rapid thermal nitridation (RTN) or liquid phase oxidation. The step removing amorphous sidewalls and bottom of the trench by acid is performed by $NH_4OH$, HF/EG, diluted hydrogen fluoride (DHF) or buffered hydrogen fluoride(BHF).

According to the method of the present invention, lower portion of the sidewalls and bottom of the trench after ion implantation are removed by acid or oxidation. The bottom of the trench is rounded, not sharply defined. Consequently, the surface of the bottle trench is increased. At the same time, the etching rate is twice that when acid or $NH_4OH$ is used to remove amorphous sidewalls and bottom of the trench. This greatly reduces the time of the removal step, thus production yield is increased. Without ion implantation, a sharply defined corners are formed at the bottom of the trench. Under these circumstances, etching the single silicon sidewalls with acid causes higher etching rate in the <111> and <110> direction. Thus, a trench with sharply defined corners is inevitably formed.

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 2A~2F illustrate the process of forming bottle trenches according to the method of the present invention.

Figure 1:
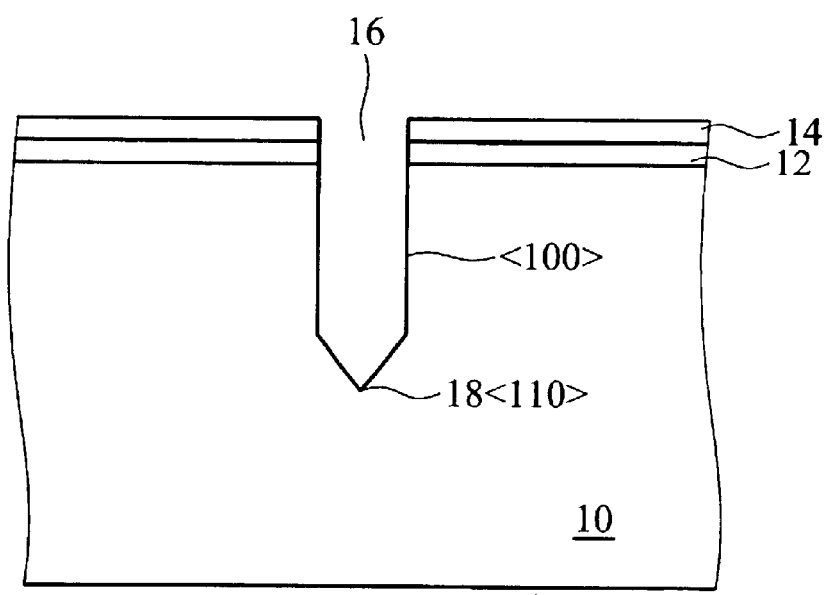
FIG. 1 is a cross-section of the DRAM trench according to a conventional method.
Figure 2A:
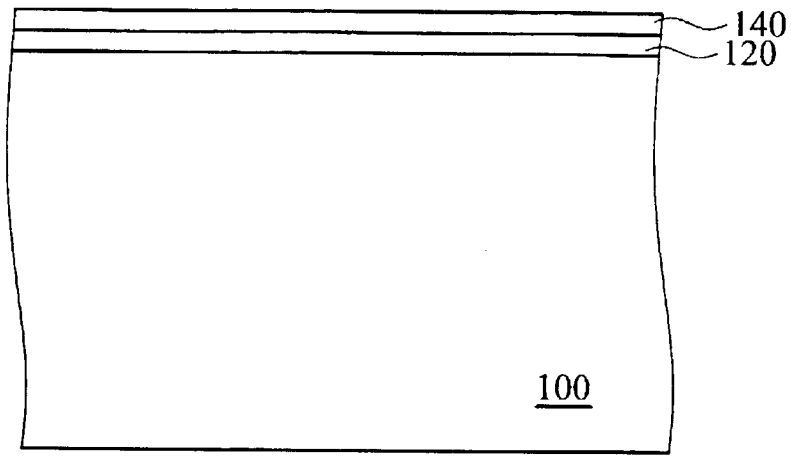
FIGS. 2A~2F illustrate the process of forming bottle trenches according to the method of the present invention.

FIG. 2A illustrates the first step of the invention, wherein a semiconductor substrate 100, such as silicon, is provided. Next, a pad stack layer is formed on the substrate 100, for example, by chemical vapor deposition (CVD). The pad stack layer includes a silicon nitride layer 140 and a silicon oxide layer 120. As shown in FIG. 2A, the silicon oxide layer 120 is formed on the substrate 100 and the silicon nitride layer 140 is formed on the silicon oxide layer 120. Thickness of the silicon nitride is preferably 200~500 Å, and the preferred thickness for silicon oxide layer is 20~100 Å. The pad stack layer is used as a hard mask later in the etching step.

Figure 2B:
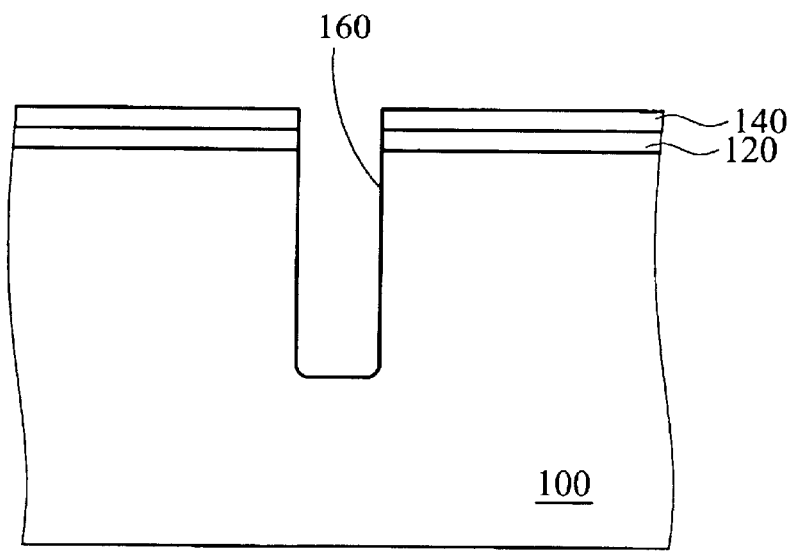
Figure 2C:
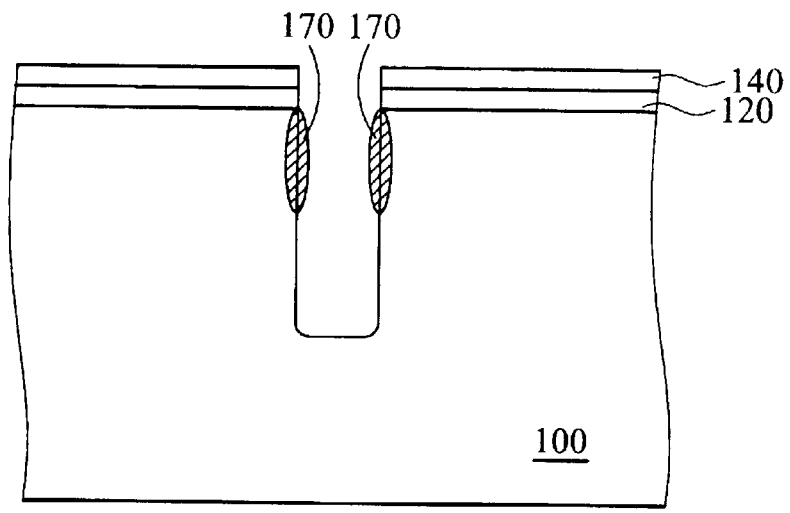

Then, an opening is formed in the pad stack layer to expose partial surface of the substrate. This opening formation is sequentially carried out by coating of a patterned photoresist, photolithography and etching, such as reactive ion etching (RIE) or plasma etching. A trench, shown in FIG. 2B, is then formed by anisotropic dry etching, such as RIE or plasma etching.

Next, a SiN layer, an amorphous silicon layer and an oxide layer are sequentially formed on the sidewalls and the bottom of the trench. Preferable thickness for the SiN layer, the amorphous silicon layer and the oxide layer are all 50~200 angstroms. Then, a sacrificial layer is formed to fill the lower portion of the trench. The sacrificial layer is preferably photoresist. The upper portion of the oxide layer not covered by the sacrificial layer is removed by acid, followed by removing the sacrificial layer in the trench. Rapid thermal nitridation (RTN) is then carried out to oxidize the amorphous silicon layer, followed by removing the remaining oxide layer, amorphous silicon layer and the lower portion of the SiN layer by acid. The remaining SiN layer on the upper sidewalls of the trench acts as a protective layer 170 160. The protective layer is preferably dielectric material, such as $SiO_2$. The protective layer protects the upper portion of the trench from damage by ion implantation and oxidation at later steps. Thickness and depth of the protective layer are not restricted, they can be modified according to the process.

Figure 2D:
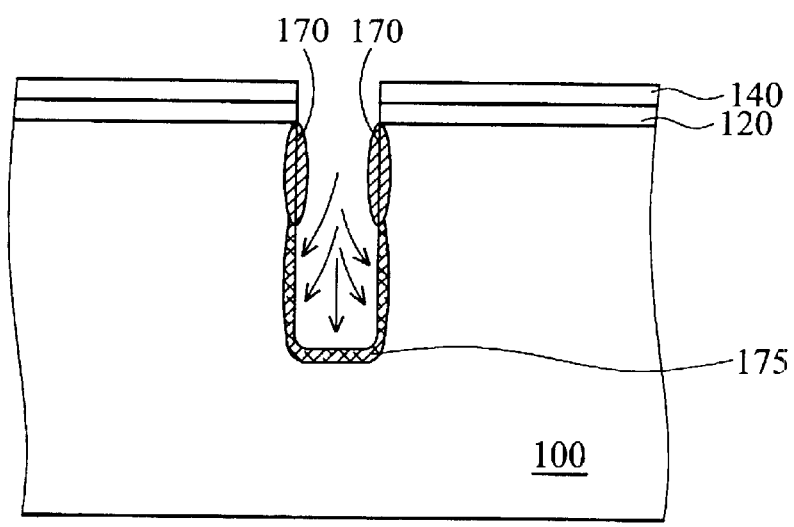
Figure 2E:
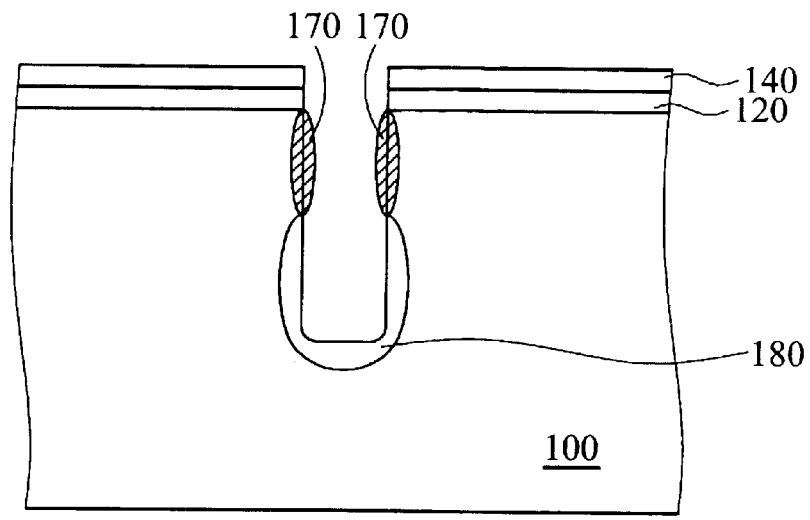

Next, as shown in FIG. 2D, sidewalls and bottom of the trench not covered by the protective layer are ion-implanted to break down the lattice structure of the silicon. Amorphous layer 175 is then formed on the sidewalls and bottom of the trench. Ions used in the ion implantation are preferably Si, Ge, or inert gas, such as Ar, He, or Ne. Preferable dosage is 1e14~1e18 atom/$cm^2$, and energy is preferably between 200 eV and 400 kev. Dry oxidation is then performed on the amorphous layer 175 to obtain a bottle-shaped oxide layer 180, as shown in FIG. 2E. At this time, the radius of the lower portion of the trench is increased and the damage caused by dry etching in the previous step is also oxidized, and can be removed at a later step.

Figure 2F:
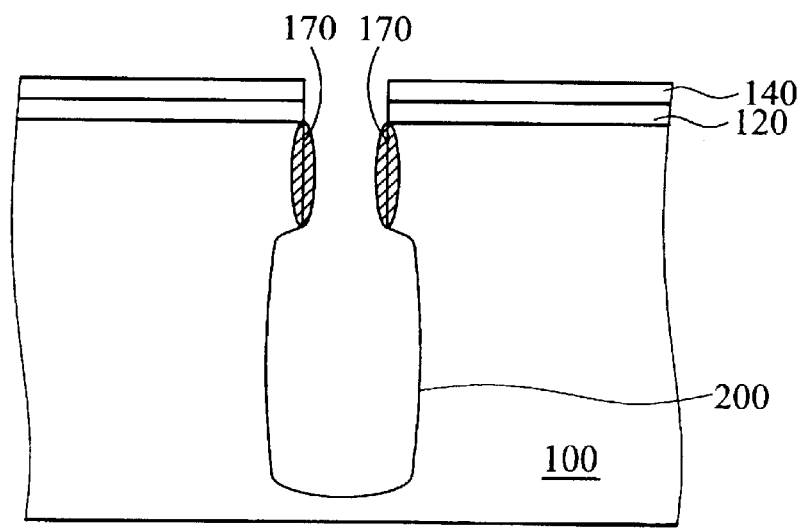

Finally, a solution of hydrogen fluoride (HF)/ethylene glycol (EG) is used to remove the bottle-shaped oxide layer 180. A bottle trench 200, shown in FIG. 2F is formed. During the removal step, the damage caused by etching on the sidewalls of the trench is also taken away. Apart from HF/EG solution, diluted HF (DHF), or buffered HF (BHF) made by the combination of $NH_4F+HF+H_2O$ are both applicable as well.

Alternatively, the amorphous layer 175 can be removed directly by $NH_4OH$ to form the bottle trench 200.

After the formation of the bottle trench, conventional methods can be adopted to remove the silicon oxide or silicon nitride as required.

According to the method for forming bottle trenches of the present invention, surface area is increased, and damage on the sidewalls of the trench caused by oxidation is removed. Problem associated with lattice <100><110> at the bottom of the trench is resolved as well. Consequently, lattice defect that induces difficulties during subsequent process is also avoided, and overall production yield is improved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming bottle trenches, comprising:
   providing a substrate formed with a pad stack layer on the top, a deep trench and a protective layer on the upper portions of sidewalls of the deep trench;
   implanting ions into the lower portions of sidewalls and bottom of the trench not covered by the protective layer to amorphize the atomic structure of the sidewalls and bottom;
   oxidizing the amorphous sidewalls and bottom of the trench to form a bottle-shaped oxide layer thereon; and
   removing the bottle-shaped oxide layer.

2. A method for forming bottle trenches in a semiconductor substrate, comprising:
   providing a substrate formed with a pad stack layer on the top, a deep trench and a protective layer on the upper portions of sidewalls of the deep trench;
   implanting ions into the lower portions of sidewalls and bottom of the trench not covered by the protective layer to amorphize the atomic structure of the sidewalls and bottom; and
   removing the amorphous sidewalls and bottom of the trench.

3. The method as claimed in claim 1, wherein the protective layer is insulating material.

4. The method as claimed in claim 2, wherein the protective layer is insulating material.

5. The method as claimed in claim 1, wherein the ions implanted in step (b) are Si, Ge, or Ar, Ne, or He of inert gas.

6. The method as claimed in claim 2, wherein the ions implanted in step (b) are Si, Ge, or Ar, Ne, or He of inert gas.

7. The method as claimed in claim 2, wherein removal the amorphous sidewalls and bottom of the trench is carried out by acid or $NH_4OH$.

8. The method as claimed in claim 7, wherein the acid is HF/EG, DHF or BHF.

9. The method as claimed in claim 1, wherein the pad stack layer comprises a pad oxide layer and a pad nitride layer.

10. The method as claimed in claim 2, wherein the pad stack layer comprises a pad oxide layer and a pad nitride layer.

11. A method for forming a bottle trench, comprising:
    providing a semiconductor substrate with an active region;
    forming a first pad oxide layer and a first pad nitride layer sequentially on the substrate to form a pad stack layer;
    defining the pad stack layer and the substrate to form a trench in the active region;
    forming a protective layer on the upper portion of the sidewalls of the trench;

implanting ions into the lower portions of sidewalls and bottom of the trench not covered by the protective layer to amorphize the atomic structure of the sidewalls and bottom; and removing the amorphous sidewalls and bottom of the trench.

12. The method as claimed in claim 11, wherein the protective layer is insulating material.

13. The method as claimed in claim 11, wherein the ions implanted are Si, Ge, or Ar, Ne, or He of inert gas.

14. The method as claimed in claim 11, wherein definition is carried out by acid or $NH_4OH$.

15. The method as claimed in claim 14, wherein the acid is HF/EG, DHF or BHF.

* * * * *